United States Patent
Chang et al.

(10) Patent No.: US 11,139,441 B2
(45) Date of Patent: Oct. 5, 2021

(54) QUANTUM DOT DEVICE AND ELECTRONIC DEVICE COMPRISING AN EMISSIVE QUANTUM DOT AND A NON-EMISSIVE QUANTUM DOT

(71) Applicant: SAMSUNG ELECTRONICS CO., LTD., Suwon-si (KR)

(72) Inventors: Jaejun Chang, Gwacheon-si (KR); Sang Jin Lee, Seoul (KR); Eun Joo Jang, Suwon-si (KR); Ha Il Kwon, Suwon-si (KR); Dae Young Chung, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/297,923

(22) Filed: Mar. 11, 2019

(65) Prior Publication Data
US 2019/0280232 A1    Sep. 12, 2019

(30) Foreign Application Priority Data

Mar. 9, 2018  (KR) .................. 10-2018-0028284
Mar. 5, 2019  (KR) .................. 10-2019-0025444

(51) Int. Cl.
*H01L 51/50*  (2006.01)
*H01L 51/00*  (2006.01)
*H01L 51/56*  (2006.01)

(52) U.S. Cl.
CPC ........ *H01L 51/502* (2013.01); *H01L 51/0003* (2013.01); *H01L 51/0037* (2013.01);
(Continued)

(58) Field of Classification Search
CPC ............. H01L 23/3735; H01L 23/3732; H01L 23/3737; H01L 21/4871; H01L 51/502;
(Continued)

(56) References Cited

U.S. PATENT DOCUMENTS

| | | | |
|---|---|---|---|
| 9,525,148 B2 | 12/2016 | Kazlas et al. | |
| 9,755,172 B2 | 9/2017 | Kazlas et al. | |
| 9,899,619 B2 | 2/2018 | Lee et al. | |
| 10,164,205 B2 | 12/2018 | Kazlas et al. | |
| 2008/0218068 A1* | 9/2008 | Cok ..................... | H05B 33/145 |
| | | | 313/505 |

(Continued)

FOREIGN PATENT DOCUMENTS

| | | |
|---|---|---|
| CN | 106654026 A | 5/2017 |
| EP | 2221355 A1 | 8/2010 |

(Continued)

OTHER PUBLICATIONS

Extended European Search Report dated Jul. 15, 2019, of the corresponding European Patent Application No. 19161264.7.

*Primary Examiner* — Mohammad M Hoque
(74) *Attorney, Agent, or Firm* — Cantor Colburn LLP

(57) ABSTRACT

A quantum dot device including an anode and a cathode facing each other, a quantum dot layer disposed between the anode and the cathode, and an electron transport layer disposed between the cathode and the quantum dot layer, wherein the quantum dot layer includes an emissive quantum dot emitting light in at least one part of a wavelength region in a visible region and a non-emissive quantum dot configured to not emit light in a visible region, and a difference between a lowest unoccupied molecular orbital (LUMO) energy level of the non-emissive quantum dot and a LUMO energy level of the electron transport layer is greater than or equal to about 0.5 electronvolts (eV).

15 Claims, 5 Drawing Sheets

(52) U.S. Cl.
CPC ...... *H01L 51/0039* (2013.01); *H01L 51/0052* (2013.01); *H01L 51/0067* (2013.01); *H01L 51/5004* (2013.01); *H01L 51/504* (2013.01); *H01L 51/5072* (2013.01); *H01L 51/56* (2013.01); *H01L 51/5056* (2013.01); *H01L 51/5088* (2013.01); *H01L 2251/301* (2013.01); *H01L 2251/552* (2013.01); *H01L 2251/558* (2013.01)

(58) Field of Classification Search
CPC ............. H01L 51/0003; H01L 51/0037; H01L 51/0039; H01L 51/0052; H01L 51/0067; H01L 51/5004; H01L 51/504; H01L 51/5072; H01L 51/56; H01L 51/5056; H01L 51/5088; H01L 2251/301; H01L 2251/552; H01L 2251/558; H01L 51/50
USPC .......................................................... 257/13
See application file for complete search history.

(56) References Cited

U.S. PATENT DOCUMENTS

| | | | |
|---|---|---|---|
| 2013/0009131 | A1* | 1/2013 | Kazlas ................ H01L 51/5004 257/13 |
| 2013/0069036 | A1 | 3/2013 | Miyata et al. |
| 2015/0228850 | A1* | 8/2015 | Zheng .................. H01L 51/502 257/13 |
| 2016/0084476 | A1 | 3/2016 | Koole et al. |
| 2017/0271605 | A1* | 9/2017 | Steckel ............... H01L 27/1225 |
| 2018/0019371 | A1 | 1/2018 | Steckel et al. |

FOREIGN PATENT DOCUMENTS

| | | |
|---|---|---|
| JP | 2010055900 A | 3/2010 |
| KR | 20120047481 A | 5/2012 |
| KR | 1237124 B1 | 2/2013 |
| KR | 1728575 B1 | 4/2017 |
| KR | 1752573 B1 | 6/2017 |

* cited by examiner

QUANTUM DOT DEVICE AND ELECTRONIC DEVICE COMPRISING AN EMISSIVE QUANTUM DOT AND A NON-EMISSIVE QUANTUM DOT

CROSS-REFERENCE TO RELATED APPLICATION

This application claims priority to and the benefit of Korean Patent Application No. 10-2018-0028284 filed in the Korean Intellectual Property Office on Mar. 9, 2018, and Korean Patent Application No. 10-2019-0025444 filed in the Korean Intellectual Property Office on Mar. 5, 2019, and all the benefits accruing therefrom under 35 U.S.C. § 119, the entire contents of which are incorporated herein by reference.

BACKGROUND

1. Field

A quantum dot device and an electronic device are disclosed.

2. Description of the Related Art

Physical characteristics (e.g., energy bandgaps, melting points, etc.) of nanoparticles that are intrinsic characteristics may be controlled by changing the particle size of the nanoparticles, unlike bulk materials. For example, semiconductor nanocrystals also known as quantum dots are supplied with photoenergy or electrical energy and may emit light in a wavelength corresponding to sizes of the quantum dots. Accordingly, quantum dots may be used as a light emitting element emitting light of a particular wavelength.

A quantum dot device including quantum dots may be used as a light emitting element. However, quantum dots are different from conventional light emitting elements, and thus a new method of improving a performance of the quantum dot device is desired.

SUMMARY

An embodiment provides a quantum dot device capable of realizing improved performance.

An embodiment provides an electronic device including the quantum dot device.

According to an embodiment, a quantum dot device includes an anode and a cathode facing each other, a quantum dot layer disposed between the anode and the cathode, and an electron transport layer disposed between the cathode and the quantum dot layer, wherein the quantum dot layer includes an emissive quantum dot emitting light in at least one part of a wavelength region in a visible region and a non-emissive quantum dot configured to not emit light in a visible region, and a difference between a lowest unoccupied molecular orbital (LUMO) energy level of the non-emissive quantum dot and a LUMO energy level of the electron transport layer is greater than or equal to about 0.5 electronvolts (eV).

The LUMO energy level of the non-emissive quantum dot may be about 0.5 eV or greater less than the LUMO energy level of the electron transport layer.

The LUMO energy level of the non-emissive quantum dot may be about 0.5 eV to about 1.5 eV less than the LUMO energy level of the electron transport layer.

An energy bandgap of the non-emissive quantum dot may be larger than an energy bandgap of the emissive quantum dot.

An energy bandgap of the non-emissive quantum dot may be greater than or equal to about 3.0 eV.

The LUMO energy level of the non-emissive quantum dot may be less than the LUMO energy level of the emissive quantum dot and less than the LUMO energy level of the electron transport layer.

A diameter of the non-emissive quantum dot may be smaller than a diameter of the emissive quantum dot.

The quantum dot layer may include a mixture of the emissive quantum dot and the non-emissive quantum dot.

The non-emissive quantum dot may be present in a lesser amount than the emissive quantum dot.

The non-emissive quantum dot may be present in an amount of less than or equal to about 20 weight percent (wt %) based on a total amount of the emissive quantum dot and the non-emissive quantum dot.

The quantum dot layer may include a first quantum dot layer including the emissive quantum dot and a second quantum dot layer including the non-emissive quantum dot.

The second quantum dot layer may be thinner than the first quantum dot layer.

A thickness of the second quantum dot layer may be less than or equal to about 20 nm.

The first quantum dot layer may be closer to the electron transport layer than the second quantum dot layer.

A HOMO energy level of the emissive quantum dot may be about 5.3 eV to about 7.5 eV.

The emissive quantum dot may be a quantum dot having a core-shell structure and the non-emissive quantum dot may be a quantum dot having a core structure without a shell.

The core of the emissive quantum dot may include zinc (Zn), tellurium (Te), and selenium (Se) and the shell of the emissive quantum dot may include ZnSeS, ZnS, or a combination thereof.

The non-emissive quantum dot may include ZnS, ZnSe, ZnTe, CdS, or a combination thereof.

The quantum dot device may further include a hole transport layer disposed between the anode and the quantum dot layer and a HOMO energy level of the hole transport layer may be about 5.2 eV to about 7.3 eV.

According to an embodiment, an electronic device includes the quantum dot device.

Performance of the quantum dot device may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
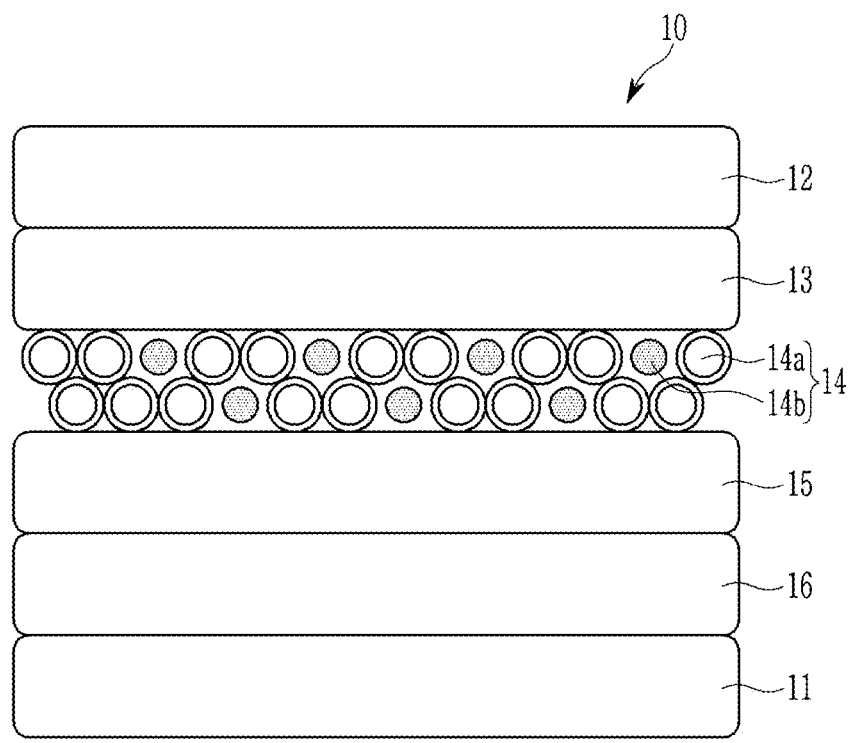
FIG. 1 is a schematic cross-sectional view of a quantum dot device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function (WF), a HOMO energy level, and a LUMO energy level are expressed as an absolute value from a vacuum level, e.g., while under vacuum. In addition, when the work function, the HOMO energy level, or the LUMO energy level is referred to as being deep, high or large, the work function, the HOMO energy level, or the LUMO energy level has a relatively large absolute value based on "0 eV" of the vacuum level, e.g., while under vacuum, while when the work function, the HOMO energy level, or the LUMO energy level is referred to as being shallow, low, or small, the work function, the HOMO energy level, or the LUMO energy level has a relatively small absolute value based on "0 eV" of the vacuum level, e.g., while under vacuum.

Hereinafter, a quantum dot device according to an embodiment is described with reference to drawings.

Figure 2A:
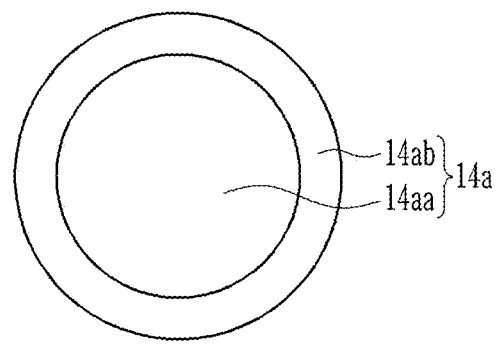
FIGS. 2A and 2B are a schematic view of an emissive quantum dot and non-emissive quantum dot included in a quantum dot layer of the quantum dot device of FIG. 1.
Figure 2B:
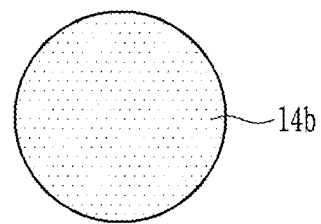
Figure 3:
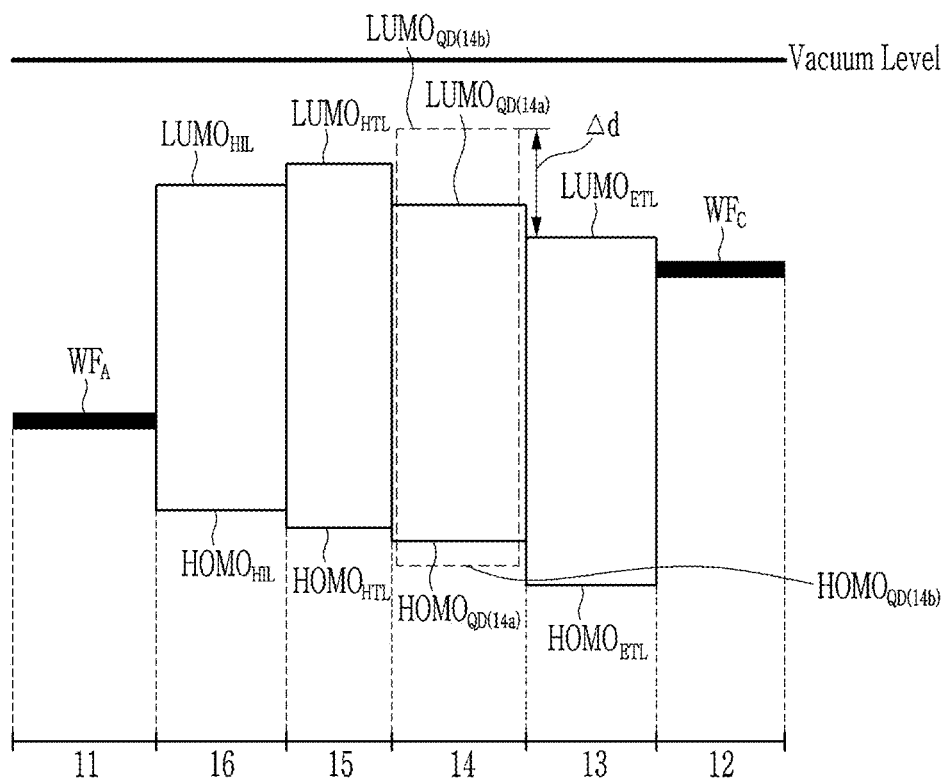
FIG. 3 is an energy diagram illustrating an exemplary energy level of the quantum dot device of FIG. 1.

FIG. 1 is a schematic cross-sectional view of a quantum dot device according to an embodiment, FIG. 2 is a schematic view of an emissive quantum dot and non-emissive quantum dot included in a quantum dot layer of the quantum dot device of FIG. 1, and FIG. 3 is an energy diagram illustrating an exemplary energy level of the quantum dot device of FIG. 1.

Referring to FIG. 1, a quantum dot device 10 according to an embodiment includes an anode 11 and a cathode 12 facing each other, and an electron transport layer 13, a quantum dot layer 14, a hole transport layer 15, and a hole injection layer 16 disposed between the anode 11 and the cathode 12.

A substrate may be disposed at the side of the anode 11 or the cathode 12. The substrate may be, for example, made of an inorganic material such as glass; an organic material such as polycarbonate, polymethylmethacrylate, polyethyleneterephthalate, polyethylenenaphthalate, polyamide, polyethersulfone, or a combination thereof; or a silicon wafer.

The anode 11 may be made of a conductor having a relatively large work function to help hole injection, and may be, for example, made of a metal, a metal oxide, a conductive polymer, or a combination thereof. The anode 11 may be, for example, made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto.

The cathode 12 may be made of a conductor having a small work function to help electron injection, and may be, for example, made of a metal, a metal oxide, a conductive polymer, or a combination thereof. The cathode 12 may be, for example, a metal such as magnesium, calcium, sodium, potassium, titanium, indium, yttrium, lithium, gadolinium, aluminum silver, tin, lead, cesium, barium, and the like or an alloy thereof; or a multi-layer structure material such as LiF/Al, LiO$_2$/Al, LiF/Ca, Liq/Al, and BaF$_2$/Ca, but is not limited thereto.

At least one of the anode 11 and the cathode 12 may be a light-transmitting electrode and the light-transmitting electrode may be, for example, made of a conductive oxide such as zinc oxide, indium oxide, tin oxide, indium tin oxide (ITO), indium zinc oxide (IZO), or fluorine doped tin oxide, or a relatively thin metal layer of a single layer or a multilayer. When one of the anode 11 and the cathode 12 is a non-light-transmitting electrode, the anode 11 or the cathode 12 may be made of, for example, an opaque conductor such as aluminum (Al), silver (Ag), or gold (Au).

The electron transport layer 13 may be disposed on one surface of the cathode 12 and may include one layer or two or more layers. The electron transporting layer 13 may include, for example, an inorganic material, an organic material, an organic/inorganic material, or a combination thereof.

The LUMO energy level (LUMO$_{ETL}$) of the electron transport layer 13 may be equal to or less than the work function (WF$_c$) of the cathode 12. A difference between the LUMO energy level (LUMO$_{ETL}$) of the electron transport layer 13 and the work function (WF$_c$) of the cathode 12 may be less than or equal to about 0.5 eV. For example, the LUMO energy level (LUMO$_{ETL}$) of the electron transport layer 13 may be about 2.5 eV to about 4.3 eV, for example, about 2.7 eV to about 4.0 eV, or about 2.7 eV to about 3.8 eV.

The electron transport layer 13 may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, Alq3, Gaq3, Inq3, Znq2, Zn(BTZ)2, BeBq2, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, HfO$_2$, etc.), and a combination thereof, but is not limited thereto.

The quantum dot layer 14 includes an emissive quantum dot 14a and a non-emissive quantum dot 14b. For example, the emissive quantum dot 14a and the non-emissive quantum dot 14b may exist in a form of a mixture in the quantum dot layer 14.

The emissive quantum dot 14a may be a quantum dot emitting light in at least one part of a wavelength region in a visible region, for example, a quantum dot emitting blue light, red light, or green light. Herein the blue light may have, for example, a peak emission wavelength ($\lambda_{max}$) of about 430 nm to about 470 nm, the red light may have, for example, a peak emission wavelength ($\lambda_{max}$) of about 620 nm to about 660 nm, and the green light may have, for example, a peak emission wavelength ($\lambda_{max}$) of about 510 nm to about 550 nm. The light emitting wavelength of the emissive quantum dot 14a may be determined according to sizes, compositions, or a combination thereof.

The emissive quantum dot 14a may have a relatively narrow full width at half maximum (FWHM). Herein, the FWHM is a width of a wavelength corresponding to a half of a peak absorption point and as the FWHM is narrower, light in a narrower wavelength region may be emitted and high color purity may be obtained. The quantum dot may have, for example, a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

The non-emissive quantum dot 14b may be a quantum dot that does not emit light in a visible region. The non-emissive quantum dot 14b is not particularly limited with respect to light in a non-visible region, for example, an infrared region, an ultraviolet (UV) region, or a combination thereof.

The emissive quantum dot 14a and the non-emissive quantum dot 14b may have, for example, a particle diameter (an average largest particle diameter for a non-spherical shape) of about 1 nm to about 100 nm, about 1 nm to about 80 nm, about 1 nm to about 50 nm, about 1 nm to about 40 nm, about 1 nm to about 30 nm, or about 1 nm to about 20 nm. Herein, the particle diameter of the non-emissive quantum dot 14b may be smaller than the particle diameter of the emissive quantum dot 14a and, for example, the particle diameter of the non-emissive quantum dot 14b may be about 0.1 times to about 0.9 times, about 0.2 times to about 0.8 times, about 0.2 times to about 0.7 times, about 0.2 times to about 0.6 times, or about 0.2 times to about 0.5 times as large as the particle diameter of the emissive quantum dot 14a.

The emissive quantum dot 14a and the non-emissive quantum dot 14b may each be a semiconductor nanocrystal, and may have various shapes, for example, an isotropic semiconductor nanocrystal, a quantum rod, or a quantum plate. The emissive quantum dot 14a and the non-emissive quantum dot 14b may independently include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be, for example, a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be, for example, a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be, for example, a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof, but is not limited thereto. The Group IV semiconductor compound may be, for example, a singular element semiconductor of Si, Ge, or a combination thereof; or a binary element semiconductor compound of SiC, SiGe, or a combination thereof, but is not limited thereto. The Group semiconductor compound may be selected, for example, from $CuInSe_2$, $CuInS_2$, CuInGaSe, CuInGaS, or a combination thereof but is not limited thereto. The Group semiconductor compound may be, for example, CuZnSnSe, CuZnSnS, or a combination thereof, but is not limited thereto. The Group V semiconductor compound may include, for example, InZnP, but is not limited thereto.

The emissive quantum dot 14a and the non-emissive quantum dot 14b may independently include the singular element semiconductor, the binary semiconductor compound, the ternary semiconductor compound, or the quaternary semiconductor compound in a substantially uniform concentration or partially different concentration distributions.

For example, the emissive quantum dot 14a and the non-emissive quantum dot 14b may include a non-cadmium-based quantum dot. Cadmium (Cd) may cause environment/health problems and a restricted element by Restriction of Hazardous Substances Directive (RoHS) in a plurality of countries, and thus the non-cadmium-based quantum dot may be effectively used.

As an example, the emissive quantum dot 14a may have a core-shell structure including the core 14aa and the shell 14ab as shown in FIG. 2A. For example, a material composition of the shell 14ab of the emissive quantum dot 14a may have a larger energy band gap than a material composition of the core 14aa of the emissive quantum dot 14a. Accordingly, a quantum confinement effect may be exhibited and thus light may be emitted. For example, the shell 14ab of the emissive quantum dot 14a may be a single layer or a multi-layer. For example, a shell, e.g., layer, of a multi-layered shell that is farther from the core may have a larger energy bandgap than a shell, e.g., layer, that is closer to the core, and thereby the quantum dot may exhibit a quantum confinement effect. A material constituting, e.g., included in, the core 14aa of the emissive quantum dot 14a and a material constituting, e.g., included in, the shell 14ab may be different from each other and may include the aforementioned semiconductor compounds within a range capable of achieving a quantum confinement effect.

For example, the emissive quantum dot 14a may include, for example, a core including a Zn—Te—Se-based first semiconductor compound including zinc (Zn), tellurium (Te), and selenium (Se) and a shell including a second semiconductor compound disposed on at least one part of the core and including a second semiconductor compound having a different composition from that of the core. The emissive quantum dot 14a of the core-shell structure may emit blue light having a peak emission wavelength in a wavelength range of less than or equal to about 470 nm, for example, a wavelength range of about 430 nm to about 470 nm.

The Zn—Te—Se-based first semiconductor compound may be, for example, a Zn—Se-based semiconductor compound including a small amount of tellurium (Te) and, for example, a semiconductor compound represented by $ZnTe_xSe_{1-x}$ (wherein, x is greater than about 0 and less than or equal to about 0.05).

For example, in the Zn—Te—Se-based first semiconductor compound, the mole amount of zinc (Zn) may be larger than that of selenium (Se), and the mole amount of selenium (Se) may be larger than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include, for example, semiconductor compounds having a larger energy bandgap than the first semiconductor compound and may be, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof which has a larger energy bandgap than the first semiconductor compound. Examples of the Group II-VI semiconductor compound, the Group III-V semiconductor compound, the Group IV-VI semiconductor compound, the Group IV semiconductor compound, the Group 1-III-VI semiconductor compound, the Group I-II-IV-VI semiconductor compound, and the Group II-III-V semiconductor compound are the same as described above. For example, the second semiconductor compound may include zinc (Zn), selenium (Se), sulfur (S), or a combination thereof. For example, the shell may include ZnSeS, ZnS, or a combination thereof. For example, the shell may have a concentration gradient of one component and, for example, an amount of sulfur (S) may increase as being apart from the core.

For example, the emissive quantum dot 14a may include, for example, a core including an In—Zn—P-based third semiconductor compound including indium (In), zinc (Zn), and phosphorus (P) and a shell disposed on at least one part of the core and including a fourth semiconductor compound having a different composition from the core. The emissive quantum dot 14a having such a core-shell structure may emit blue light, green light or red light, For example, blue light may have a peak emission wavelength in a wavelength range of less than or equal to about 470 nm, for example, a wavelength range of about 430 nm to about 470 nm.

In the In—Zn—P-based third semiconductor compound, a mole ratio of zinc (Zn) relative to indium (In) may be greater than or equal to about 25:1. For example, in the In—Zn—P-based third semiconductor compound, the mole ratio of zinc (Zn) relative to indium (In) may be greater than or equal to about 28:1, greater than or equal to about 29:1, or greater than or equal to about 30:1. For example, in the In—Zn—P-based first semiconductor compound, the mole ratio of zinc (Zn) relative to indium (In) may be less than or equal to about 55:1, for example, less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, semiconductor compounds having a larger energy bandgap than the third semiconductor compound and may be, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof which has a larger energy bandgap than the third semiconductor compound. Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above. For example, the fourth semiconductor compound may include zinc (Zn) and sulfur (S), and optionally selenium (Se). For example, the shell may include at least one internal shell disposed near, e.g., adjacent to, the core and an outermost shell disposed at the outermost shell of the quantum dot and at least one of the internal shell and the outermost shell may include the fourth semiconductor compound of ZnS or ZnSeS.

As an example, the non-emissive quantum dot 14b may have a core structure without a shell as shown in FIG. 2B. Thus, the non-emissive quantum dot 14b may not emit light because the non-emissive quantum dot 14b does not have a quantum confinement effect unlike the emissive quantum dot 14a. The non-emissive quantum dot 14b may be selected from the aforementioned semiconductor compounds and may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof, for example, ZnS, ZnSe, ZnTe, CdS, or a combination thereof.

The emissive quantum dot 14a and the non-emissive quantum dot 14b may have a different energy level and, for example, an energy bandgap of the non-emissive quantum dot 14b may be larger than an energy bandgap of the emissive quantum dot 14a. For example, the energy bandgap of the non-emissive quantum dot 14b may be greater than or equal to about 3.0 eV, greater than or equal to about 3.1 eV, greater than or equal to about 3.2 eV, greater than or equal to about 3.4 eV, greater than or equal to about 3.6 eV, greater than or equal to about 3.8 eV, or greater than or equal to about 4.0 eV, and within the ranges, for example, about 3.0 eV to about 5.5 eV, about 3.1 eV to about 5.5 eV, about 3.2 eV to about 5.5 eV, about 3.4 eV to about 5.5 eV, about 3.6 eV to about 5.5 eV, about 3.8 eV to about 5.5 eV, or about 4.0 eV to about 5.5 eV.

For example, a LUMO energy level ($LUMO_{QD(14b)}$) of the non-emissive quantum dot 14b may be less than a LUMO energy level ($LUMO_{QD(14a)}$) of the emissive quantum dot 14a. For example, the LUMO energy level ($LUMO_{QD(14b)}$) of the non-emissive quantum dot 14b may be greater than or equal to about 0.2 eV, greater than or equal to about 0.4 eV, greater than or equal to about 0.5 eV, greater than or equal to about 0.7 eV, or greater than or equal to about 0.9 eV, and within the ranges, for example, about 0.2 eV to about 1.5 eV, about 0.4 eV to about 1.5 eV, about 0.5 eV to about 1.5 eV, about 0.7 eV to about 1.5 eV, or about 0.9 eV to about 1.5 eV less than the LUMO energy level ($LUMO_{QD(14a)}$) of the emissive quantum dot 14a.

For example, a LUMO energy level ($LUMO_{QD(14b)}$) of the non-emissive quantum dot 14b may be different from a LUMO energy level ($LUMO_{ETL}$) of the electron transport layer 13, and a difference (A d) between LUMO energy levels of the non-emissive quantum dot 14b and the electron transport layer (ETL) 13 may be, for example, greater than or equal to about 0.5 eV. For example, the difference (A d) between LUMO energy levels of the non-emissive quantum dot 14b and the electron transport layer (ETL) 13 may be about 0.5 eV to about 1.5 eV. For example, the LUMO energy level ($LUMO_{QD(14b)}$) of the non-emissive quantum dot 14b may be greater than or equal to about 0.5 eV less than the LUMO energy level of the electron transport layer 13, and, for example, the LUMO energy level of the non-emissive quantum dot 14b may be about 0.5 eV to about 1.5 eV less than the LUMO energy level of the electron transport layer 13.

For example, the LUMO energy level ($LUMO_{QD(14b)}$) of the non-emissive quantum dot 14b may be less than the LUMO energy level ($LUMO_{QD(14a)}$) of the emissive quantum dot 14a and the LUMO energy level ($LUMO_{ETL}$) of the electron transport layer 13. For example, the LUMO energy level ($LUMO_{QD(14b)}$) of the non-emissive quantum dot 14b may be greater than or equal to about 0.5 eV less than the LUMO energy level ($LUMO_{QD(14a)}$) of the emissive quantum dot 14a and the LUMO energy level ($LUMO_{ETL}$) of the electron transport layer 13. For example, the LUMO energy level ($LUMO_{QD(14b)}$) of the non-emissive quantum dot 14b may be about 0.5 eV to about 1.5 eV less than the LUMO energy level ($LUMO_{QD(14a)}$) of the emissive quantum dot 14a and the LUMO energy level ($LUMO_{ETL}$) of the electron transport layer 13. Due to a low LUMO energy level of the non-emissive quantum dot 14b, the non-emissive quantum dot 14b may act as a barrier to electrons moving from the electron transport layer 13 to the quantum dot layer 14 to lower the electron mobility.

In a quantum dot device, mobility of holes and electrons may be different, and for example, mobility of electrons may be higher than mobility of holes. Accordingly, mobility imbalances between the holes moving from the anode 11 to the quantum dot layer 14 and the electrons moving from the cathode 12 to the quantum dot layer 14 may occur, and thus the electrons may not be coupled with holes at the emission site of the quantum dot layer 14 and the uncoupled electrons may accumulate at the interface between the quantum dot layer 14 and the hole transport layer 15. As described above, electrons accumulated at the interface between the quantum dot layer 14 and the hole transport layer 15 deteriorate the quantum dot device, thereby shortening a life-span of the quantum dot device.

In an embodiment, the non-emissive quantum dot 14b having a relatively low LUMO energy level may be included in the quantum dot layer 14, so that the mobility of electrons moving from the electron transport layer 13 to the quantum dot layer 14 may be controlled. Accordingly, the mobility between the holes moving from the anode 11 to the quantum dot layer 14 and the electrons moving from the cathode 12 to the quantum dot layer 14 may be balanced to increase the luminous efficiency of the quantum dot device 10 and electrons may be prevented from being accumulated at the interface between the quantum dot layer 14 and the hole transport layer 15 to improve life-span characteristics of the quantum dot device.

The HOMO energy level ($HOMO_{QD(14a)}$) of the emissive quantum dot 14a may be equal to or different the HOMO energy level ($HOMO_{QD(14b)}$) of the non-emissive quantum dot 14b. The HOMO energy level ($HOMO_{QD(14a)}$) of the emissive quantum dot 14a and the HOMO energy level ($HOMO_{QD(14b)}$) of the non-emissive quantum dot 14b may be relatively high and may be, for example, greater than or equal to about 5.3 eV, greater than or equal to about 5.4 eV, greater than or equal to about 5.5 eV, greater than or equal to about 5.6 eV, greater than or equal to about 5.7 eV, greater than or equal to about 5.8 eV, greater than or equal to about 5.9 eV, or greater than or equal to about 6.0 eV. The HOMO energy level ($HOMO_{QD(14a)}$) of the emissive quantum dot 14a and the HOMO energy level ($HOMO_{QD(14b)}$) of the non-emissive quantum dot 14b may be, for example, about 5.3 eV to about 7.5 eV, about 5.3 eV to about 7.2 eV, about 5.4 eV to about 7.2 eV, about 5.4 eV to about 7.0 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

As described above, the emissive quantum dot 14a and the non-emissive quantum dot 14b may exist in a form of a mixture in the quantum dot layer 14. In this case, the non-emissive quantum dot 14b may be included in a lesser amount than the emissive quantum dot 14a. For example, the non-emissive quantum dot 14b may be included in an amount of less than about 50 wt %, for example, less than or equal to about 40 wt %, less than or equal to about 30 wt %, or less than or equal to about 20 wt % based on a total amount of the emissive quantum dot 14a and the non-emissive quantum dot 14b.

The quantum dot layer 14 may have, for example, a thickness of about 5 nm to 200 nm, about 10 nm to about 150 nm, about 10 nm to about 100 nm, about 15 nm to about 80 nm, about 20 nm to about 50 nm, or about 25 nm to about 40 nm.

The hole transport layer 15 and the hole injection layer 16 may be disposed between the anode 11 and the quantum dot layer 14, wherein the hole transport layer 15 is disposed at the side of the quantum dot layer 14, while the hole injection layer 16 is disposed at the side of the anode 11, and holes supplied from the anode 11 may be transported to the quantum dot layer 14 through the hole injection layer 16 and the hole transport layer 15. For example, the hole transport layer 15 may be in contact with the quantum dot layer 14, and the hole injection layer 16 may be in contact with the anode 11.

The HOMO energy level ($HOMO_{HIL}$) of the hole injection layer 16 may be between a work function of the anode 11 and a HOMO energy level of the quantum dot layer 14 and may be, for example, about 5.0 eV to about 5.5 eV.

The hole injection layer 16 may include a conductive compound, for example, a conductive metal oxide, a conductivity monomer, a conductive oligomer, a conductive polymer, a conductive ion compound, or a combination thereof, for example, a conductive metal oxide, a conductivity monomer, a conductivity oligomer, a conductive polymer, a conductive ion compound, or a combination thereof having conductivity of greater than or equal to about $1\times10^{-7}$ siemens per centimeter (S/cm), for example, a conductive metal oxide, a conductivity monomer, a conductivity oligomer, a conductive polymer, a conductive ion compound, or a combination thereof having conductivity of about $1\times10^{-7}$ S/cm to about 1000 S/cm. The conductive compound may include, for example, polythiophene, polyaniline, polypyrrole, poly(para-phenylene), polyfluorene, poly(3,4-ethylenedioxythiophene), poly(3,4-ethylenedioxythiophene): polystyrene sulfonate (PEDOT:PSS), a derivative thereof, or a combination thereof, but is not limited thereto.

A HOMO energy level ($HOMO_{HTL}$) of the hole transport layer 15 may be between the HOMO energy level ($HOMO_{HIL}$) of the hole injection layer 16 and the HOMO energy level ($HOMO_{QD(14a)}$) of the emissive quantum dot 14a of the quantum dot layer 14. Accordingly, a step-like energy level may be formed from the hole injection layer 16 to the quantum dot layer 14, and the hole mobility may be effectively increased.

The HOMO energy level ($HOMO_{HTL}$) of the hole transport layer 15 may have a relatively high HOMO energy level like the quantum dot layer 14 so as to match the HOMO energy level ($HOMO_{QD(14a)}$) of the emissive quantum dot 14a of the quantum dot layer 14.

For example, a difference between the HOMO energy level ($HOMO_{HTL}$) of the hole transport layer 15 and the HOMO energy level ($HOMO_{QD(14a)}$) of the quantum dot of the emissive quantum dot 14a of the quantum dot layer 14 may be less than or equal to about 0.5 eV, for example, about 0 eV to about 0.5 eV, about 0.01 eV to about 0.4 eV, about 0.01 eV to about 0.3 eV, about 0.01 eV to about 0.2 eV, or about 0.01 eV to about 0.1 eV. For example, the HOMO energy level ($HOMO_{HTL}$) of the hole transport layer 15 may be equal to than the HOMO energy level ($HOMO_{QD(14a)}$) of the emissive quantum dot 14a of the quantum dot layer 14 or the HOMO energy level ($HOMO_{HTL}$) of the hole transport layer 15 may be less than or equal to about 0.5 eV less than the HOMO energy level ($HOMO_{QD(14a)}$) of the emissive quantum dot 14a of the quantum dot layer 14.

For example, the HOMO energy level ($HOMO_{HTL}$) of the hole transport layer 15 may be greater than or equal to about 5.2 eV, greater than or equal to about 5.4 eV, greater than or equal to about 5.6 eV, or greater than or equal to about 5.8 eV. For example, the HOMO energy level ($HOMO_{HTL}$) of the hole transport layer 15 may be about 5.2 eV to about 7.3 eV, about 5.4 eV to about 7.3 eV, about 5.4 eV to about 7.1 eV, about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole transport layer 15 may not be particularly limited provided the material of the hole transport layer 15 provides desired energy level characteristic and may include, for example, a polymer of poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), or 1,1-bis[(di-4-tolylamino)phenylcyclohexane (TAPC), a p-type metal oxide (e.g., NiO, $WO_3$, or $MoO_3$), or a carbon-based material such as graphene oxide, but is not limited thereto.

Figure 4:
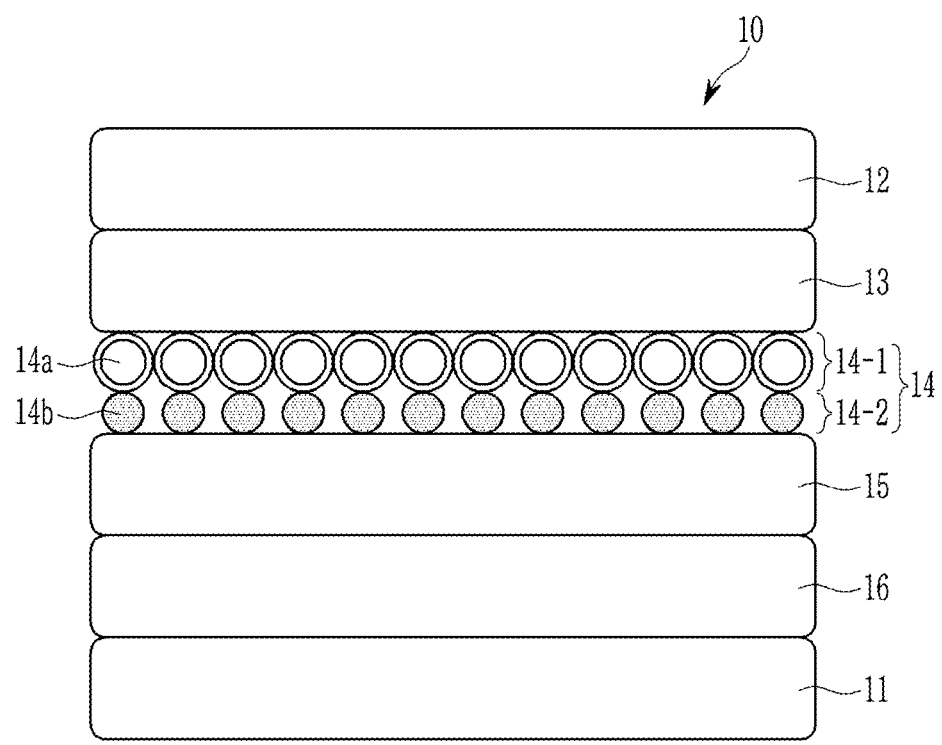
FIG. 4 is a cross-sectional view schematically showing a quantum dot device according to an embodiment.
Figure 5:
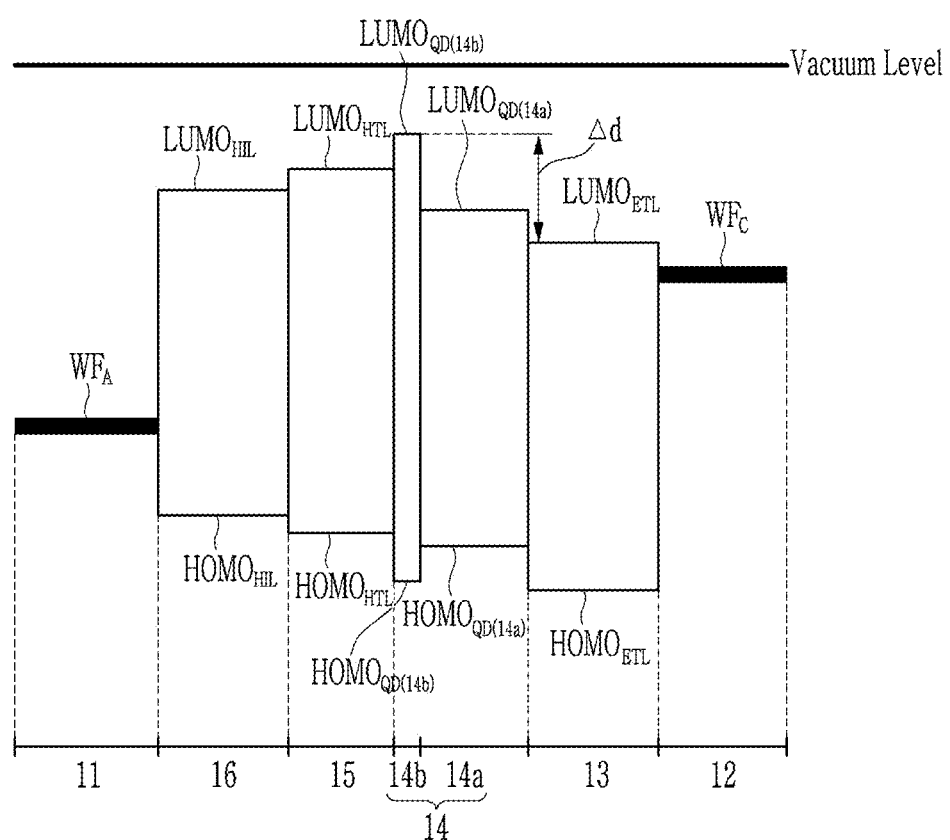
FIG. 5 is an energy diagram illustrating an exemplary energy level of the quantum dot device of FIG. 4.

FIG. 4 is a cross-sectional view schematically showing a quantum dot device according to an embodiment.

Referring to FIG. 4, a quantum dot device 10 according to an embodiment includes an anode 11 and a cathode 12 facing each other and an electron transport layer 13, a quantum dot layer 14, a hole transport layer 15, and a hole injection layer 16 disposed between the anode 11 and the cathode 12, unlike the above-described embodiment.

However, the quantum dot device according to an embodiment may differ from an embodiment in that the quantum dot layer 14 may include a first quantum dot layer 14-1 close, e.g., adjacent, to the electron transport layer 13 and may include the emissive quantum dot 14a and a second quantum dot layer 14-2 close, e.g., adjacent, to the hole transport layer 15 and may include the non-emissive quantum dot 14b.

The first quantum dot layer 14-1 may include the above emissive quantum dot 14a and may include an emission site where holes supplied from the anode 11 and electrons supplied from the cathode 12 combine to emit light.

The second quantum dot layer 14-2 may include the non-emissive quantum dot 14b and does not include an emission site. As described above, the LUMO energy level ($LUMO_{QD(14b)}$) of the non-emissive quantum dot 14b included in the second quantum dot layer 14-2 is less than the LUMO energy level ($LUMO_{QD(14a)}$) of the emissive quantum dot 14a, and thus it may be possible to reduce and/or block the mobility of the electrons so that electrons passing through the first quantum dot 14-1 may not flow into the hole transport layer 15. That is, the second quantum dot layer 14-2 may act as an electron blocking layer to prevent electrons from accumulating at the interface between the quantum dot layer 14 and the hole transport layer 15 and, thus degradation of the quantum dot device may be reduced and/or prevented.

The second quantum dot layer 14-2 may be thinner than the first quantum dot layer 14-1. A thickness of the second quantum dot layer 14-2 may be less than or equal to about 20 nm, for example, about 1 nm to about 20 nm, about 1 nm to about 18 nm, about 1 nm to about 15 nm, about 1 nm to about 12 nm, about 1 nm to about 10 nm, but is not limited thereto. The electron transport layer 13, the quantum dot layer 14, the hole transport layer 15, and the hole injection layer 16 may be, for example, formed with a solution process or deposition process and the solution process may be, for example, spin coating, slit coating, inkjet printing, a nozzle printing, spraying, a doctor blade coating, or a combination thereof, but is not limited thereto.

The quantum dot device may be, for example, applied to various electronic devices such as display devices or lighting devices, and the like.

Hereinafter, the embodiments are illustrated in more detail with reference to examples. However, these examples are exemplary, and the present scope is not limited thereto.

Synthesis of Quantum Dot

Synthesis Example 1

Step 1: Synthesis of ZnTeSe Core

Selenium (Se) and tellurium (Te) are dispersed in trioctylphosphine (TOP) to obtain a 2 molar (M) Se/TOP stock solution and a 0.1 M Te/TOP stock solution.

0.125 millimoles (mmol) of zinc acetate, 0.25 mmol of palmitic acid, and 0.25 mmol of hexadecylamine are put along with 10 milliliters (mL) of trioctylamine in a reactor and then, heated at 120° C. under vacuum. After 1 hour, an atmosphere in the reactor is converted into nitrogen.

After heating the reactor at 300° C., the Se/TOP stock solution and the Te/TOP stock solution are rapidly added thereto in a Te:Se ratio of 1:25. After 10, 30 or 60 minutes, the reaction solution is rapidly cooled down to room temperature, acetone is added thereto, and a precipitate obtained by centrifuging the mixture is dispersed in toluene to obtain a ZnTeSe quantum dot.

Step 2: Synthesis of ZnTeSe Core/ZnSeS Shell Emissive Quantum Dot 1.8 mmoL (0.336 grams (g)) of zinc acetate, 3.6 mmol (1.134 g) of oleic acid, and 10 mL of trioctylamine are put into a flask and placed under vacuum at 120° C. for 10 minutes. The inside of flask is substituted with nitrogen ($N_2$) and heated at 180° C. The ZnTeSe core obtained in Synthesis Example 1 is put therein within 10 seconds, subsequently, 0.04 mmol of Se/TOP is slowly injected and then heated at 280° C. Then, 0.01 mmol of S/TOP is put thereto and heated at 320° C. and reacted for 10 minutes. Subsequently, a mixed solution of 0.02 mmol of Se/TOP and 0.04 mmol of S/TOP is slowly injected and reacted again for 20 minutes. Then, the step of injecting Se and S by changing the mixing ratio thereof and reacting the same for 20 minutes is repeated. The mixed solution of Se and S uses a mixed solution of 0.01 mmol Se/TOP+0.05 mmol S/TOP, a mixed solution of 0.005 mmol Se/TOP+0.1 mmol S/TOP, and a solution of 0.5 mmol S/TOP, sequentially. After completing all the reaction, the reactor is cooled, the prepared nanocrystal is precipitated with ethanol, and the obtained nanocrystal is centrifuged with ethanol and dispersed in toluene to obtain a ZnTeSe/ZnSeS core-shell emissive quantum dot.

Synthesis Example 2: Preparation of ZnS Core Non-Emissive Quantum Dot

Sulfur (S) is dispersed in trioctylphosphine (TOP) to obtain a 1 M S/TOP stock solution. Diethylzinc is dissolved in hexane to obtain 1 M diethylzinc stock solution. An organic ligand including an oleic acid and the diethylzinc stock solution are dissolved in trioctylamine in a 300 ml flask and heated at 120° C. under vacuum. After an atmosphere in the flask is converted into an inert gas, the S/TOP stock solution is injected in the flask and heated to 300° C. and reacted for 40 minutes. After reaction, the reaction solution is rapidly cooled down to room temperature and ethanol is added thereto, and a precipitate obtained by centrifuging the mixture is dispersed in toluene to obtain ZnS non-emissive quantum dot. A molar ratio of Zn:S is about 2:1.

Manufacture of Quantum Dot Device I

Example 1

A glass substrate deposited with indium tin oxide (ITO) (work function (WF): 4.8 electronvolts (eV)) is surface-treated with an ultraviolet (UV)-ozone for 15 minutes, spin-coated with a poly(3,4-ethylenedioxythiophene):polystyrene sulfonate (PEDOT:PSS) solution (H.C. Starks Co., Ltd.), and heat-treated under an air atmosphere at 150° C. for 10 minutes and then, under an $N_2$ atmosphere at 150° C. for 10 minutes to form a 25 nm-thick hole injection layer (highest occupied molecular orbital (HOMO): 5.3 eV and lowest unoccupied molecular orbital (LUMO): 2.7 eV). Subsequently, on the hole injection layer, a 25 nanometer (nm)-thick hole transport layer (HOMO: 5.6 eV, LUMO: 2.7 eV) is formed by spin-coating a hole transport material (poly[(9,9-dioctylfluorenyl-2,7-diyl)-co-(4,4'-(N-(4-sec-butylphenyl)diphenylamine)], Sumitomo Chemical Co., Ltd.) and heat-treating the same at 150° C. for 30 minutes. Then, on the hole transport layer, a quantum dot layer (HOMO: 5.7 eV, LUMO: 3.0 eV) is formed by spin-coating a solution including the ZnTeSe/ZnS core/shell emissive quantum dot (peak emission wavelength: 453 nm) obtained in Synthesis Example 1 and the ZnS core non-emissive quantum dot obtained in Synthesis Example 2 in a ratio of 95:5 (weight (wt):wt) and heat-treating the same at 150° C. for 30 minutes. Then, on the quantum dot layer, a 40 nm-thick electron transport layer (LUMO: 2.9 eV) is formed by depositing an electron transport material (a blend material of anthracene-based material and a pyrazole-based material, Novaled) under vacuum and thereon a cathode is formed by depositing, under vacuum, 8-hydroxyquinolinato lithium (Liq) to a thickness of 5 nm and aluminum (Al) to a thickness of 100 nm to manufacture a quantum dot device.

Example 2

A quantum dot device is manufactured in the same manner as in Example 1, except that the quantum dot layer is formed using a solution including the ZnTeSe/ZnSeS core/shell emissive quantum dot and the ZnS core non-emissive quantum dot in a ratio of 80:20 (wt:wt).

Comparative Example 1

A quantum dot device is manufactured in the same manner as in Example 1, except that the quantum dot layer includes only the ZnTeSe/ZnSeS core/shell emissive quantum dot instead of the mixture of the ZnTeSe/ZnSeS core/shell emissive quantum dot and the ZnS core non-emissive quantum dot.

Evaluation I

Current-voltage-luminescence characteristics of the quantum dot devices according to Examples 1 and 2 and Comparative Example 1 are evaluated.

The current-voltage-luminescence characteristics are evaluated by using a Keithley 220 current source and a Minolta CS200 spectroradiometer.

The results are shown in Table 1.

TABLE 1

|  | Example 1 | Example 2 | Comparative Example 1 |
|---|---|---|---|
| $EQE_{max}$ (%) | 3.2 | 4.6 | 1.9 |
| External Quantum Efficiency (EQE) at 100 nit (%) | 3.0 | 4.5 | 1.5 |

TABLE 1-continued

|  | Example 1 | Example 2 | Comparative Example 1 |
|---|---|---|---|
| EQE at 500 nit (%) | 3.0 | 3.5 | 1.9 |
| $Cd/A_{max}$ (%) | 2.2 | 3.3 | 1.2 |
| $Cd/m^2$ at 5 mA | 105.7 | 158.2 | 44.2 |
| $\lambda_{max}$ (nm) | 456 | 456 | 456 |
| Full width at half maximum (FWHM) (nm) | 26 | 27 | 27 |
| CIE x | 0.143 | 0.143 | 0.145 |
| CIE y | 0.072 | 0.073 | 0.073 |

\* $EQE_{max}$: maximum external quantum efficiency
\* EQE at 100 nit: external quantum efficiency at 100 nit (candelas per square meter ($Cd/m^2$))
\* EQE at 500 nit: external quantum efficiency at 500 nit
\* $Cd/A_{max}$: maximum current efficiency (candela per ampere)
\* $Cd/m^2$ at 5 mA: luminance at 5 milliamperes (mA)

Referring to Table 1, the quantum dot devices according to Examples 1 and 2 show improved luminous efficiency and luminance compared with the quantum dot device according to Comparative Example 1.

Manufacture of Quantum Dot Device II

Example 3

A glass substrate deposited with ITO (WF: 4.8 eV) is surface-treated with an UV-ozone for 15 minutes, spin-coated with a PEDOT:PSS solution (H.C. Starks Co., Ltd.), and heat-treated under an air atmosphere at 150° C. for 10 minutes and then, under an $N_2$ atmosphere at 150° C. for 10 minutes to form a 25 nm-thick hole injection layer (HOMO: 5.3 eV and LUMO: 2.7 eV). Subsequently, on the hole injection layer, a 25 nm-thick hole transport layer (HOMO: 5.6 eV, LUMO: 2.7 eV) is formed by spin-coating a hole transport material (poly[(9,9-dioctylfluorenyl-2,7-diyl)-co-(4,4'-(N-(4-sec-butylphenyl)diphenylamine)], Sumitomo Chemical Co., Ltd.) and heat-treating the same at 150° C. for 30 minutes. Then, on the hole transport layer, a 5 nm-thick lower quantum dot layer (HOMO: 6.3 eV, LUMO: 2.1 eV) is formed by spin-coating the ZnS core non-emissive quantum dot obtained in Synthesis Example 2 and heat-treating the same at 150° C. for 30 minutes. Then, on the lower quantum dot layer, a 20 nm-thick upper quantum dot layer (HOMO: 5.7 eV, LUMO: 3.0 eV) is formed by spin-coating the ZnTeSe/ZnSeS core/shell emissive quantum dot (peak emission wavelength: 453 nm) obtained in Synthesis Example 1 and heat-treating the same at 150° C. for 30 minutes. Then, on the upper quantum dot layer, a 40 nm-thick electron transport layer is formed by depositing an electron transport material (a blend material of anthracene-based material and a pyrazole-based material, Novaled) under vacuum and thereon a cathode is formed by depositing, under vacuum, Liq to a thickness of 5 nm and aluminum (Al) to a thickness of 100 nm to manufacture a quantum dot device.

Comparative Example 2

A quantum dot device is manufactured in the same manner as in Example 3, except that the lower quantum dot layer is not formed.

Evaluation II

Current-voltage-luminescence characteristics of the quantum dot devices according to Example 3 and Comparative Example 2 are evaluated.

The results are shown in Table 2.

TABLE 2

|  | Example 3 | Comparative Example 2 |
|---|---|---|
| $EQE_{max}$ | 4.3 | 2.7 |
| EQE at 100 nit | 4.3 | 2.7 |
| EQE at 500 nit | 3.6 | 2.5 |
| $Cd/A_{max}$ | 3.1 | 2.1 |
| $Cd/m^2$ at 5 mA | 148.5 | 107.8 |
| $\lambda_{max}$ | 457 | 457 |
| Full width at half maximum (FWHM) (nm) | 30 | 31 |
| CIE x | 0.1448 | 0.1450 |
| CIE y | 0.0726 | 0.0825 |

Referring to Table 2, the quantum dot device according to Example 3 exhibits improved luminous efficiency and luminance compared with the quantum dot device according to Comparative Example 2.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot device, comprising
an anode and a cathode facing each other and disposed apart from each other in a first direction,
a quantum dot layer disposed between the anode and the cathode, and
an electron transport layer disposed between the cathode and the quantum dot layer, the electron transport layer comprising an n-type metal oxide,
wherein the quantum dot layer comprises an emissive quantum dot configured to emit light in at least one part of a wavelength region in a visible region and a non-emissive quantum dot configured to not emit light in the visible region,
the whole of the quantum dot layer in a second direction perpendicular to the first direction is a light-emitting region configured to emit light by the emissive quantum dot,
the emissive quantum dot of the quantum dot layer is in contact with the electron transport layer,
a difference between an absolute value of a lowest unoccupied molecular orbital energy level of the non-emissive quantum dot and an absolute value of a lowest unoccupied molecular orbital energy level of the electron transport layer is about 0.5 electronvolts to about 1.5 electronvolts,
the absolute value of the lowest unoccupied molecular orbital energy level of the non-emissive quantum dot is less than the absolute value of the lowest unoccupied molecular orbital energy level of the emissive quantum dot and the absolute value of the lowest unoccupied molecular orbital energy level of the electron transport layer, respectively, and
the emissive quantum dot has a core-shell structure, the core of the emissive quantum dot comprises zinc, tellurium, and selenium, the shell of the emissive quantum dot comprises ZnSeS, ZnS, or a combination thereof, the non-emissive quantum dot has a core structure without a shell, and the non-emissive quantum dot comprises ZnS, ZnSe, ZnTe, CdS, or a combination thereof.

2. The quantum dot device of claim 1, wherein the absolute value of the lowest unoccupied molecular orbital energy level of the non-emissive quantum dot is about 0.7 electronvolts to about 1.5 electronvolts less than the absolute value of the lowest unoccupied molecular orbital energy level of the electron transport layer.

3. The quantum dot device of claim 1, wherein an energy bandgap of the non-emissive quantum dot is larger than an energy bandgap of the emissive quantum dot.

4. The quantum dot device of claim 1, wherein an energy bandgap of the non-emissive quantum dot is about 3.0 electronvolts to about 5.5 electronvolts.

5. The quantum dot device of claim 1, wherein a diameter of the non-emissive quantum dot is smaller than a diameter of the emissive quantum dot.

6. The quantum dot device of claim 1, wherein the quantum dot layer comprises a mixture of the emissive quantum dot and the non-emissive quantum dot.

7. The quantum dot device of claim 6, wherein the non-emissive quantum dot is present in a lesser amount than the emissive quantum dot.

8. The quantum dot device of claim 6, wherein the non-emissive quantum dot is present in an amount of greater than 0 weight percent and less than or equal to about 20 weight percent, based on a total amount of the emissive quantum dot and the non-emissive quantum dot.

9. The quantum dot device of claim 1, wherein the quantum dot layer comprises
a first quantum dot layer comprising the emissive quantum dot and
a second quantum dot layer comprising the non-emissive quantum dot.

10. The quantum dot device of claim 9, wherein the second quantum dot layer is thinner than the first quantum dot layer.

11. The quantum dot device of claim 9, wherein a thickness of the second quantum dot layer is about 1 nanometer to about 20 nanometers.

12. The quantum dot device of claim 9, wherein the first quantum dot layer is closer to the electron transport layer than the second quantum dot layer.

13. The quantum dot device of claim 1, wherein an absolute value of a highest occupied molecular orbital energy level of the emissive quantum dot is about 5.3 electronvolts to about 7.5 electronvolts.

14. The quantum dot device of claim 1, further comprising a hole transport layer disposed between the anode and the quantum dot layer and
an absolute value of a highest occupied molecular orbital energy level of the hole transport layer is about 5.2 electronvolts to about 7.3 electronvolts.

15. An electronic device comprising the quantum dot device of claim 1.

* * * * *